(12) United States Patent
Rostaing et al.

(10) Patent No.: US 10,886,915 B2
(45) Date of Patent: Jan. 5, 2021

(54) DEVICE MODIFYING THE IMPEDANCE VALUE OF A REFERENCE RESISTOR

(71) Applicant: COMMISSARIAT A L'ENERGIE ATOMIQUE ET AUX ENERGIES ALTERNATIVES, Paris (FR)

(72) Inventors: Jean-Pierre Rostaing, La Cote Saint-Andre (FR); Arnaud Peizerat, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/128,133

(22) Filed: Sep. 11, 2018

(65) Prior Publication Data
US 2019/0081625 A1    Mar. 14, 2019

(30) Foreign Application Priority Data

Sep. 13, 2017  (FR) ...................................... 17 58491

(51) Int. Cl.
*H03K 17/687*    (2006.01)
*H03F 3/45*    (2006.01)
(Continued)

(52) U.S. Cl.
CPC ....... *H03K 17/687* (2013.01); *H03F 3/45179* (2013.01); *H03F 3/70* (2013.01);
(Continued)

(58) Field of Classification Search
CPC .. H03F 3/45179; H03F 3/70; H03F 2200/129; H03F 2200/144; H03K 17/687
See application file for complete search history.

(56) References Cited

U.S. PATENT DOCUMENTS 6,897,528 B2   5/2005  Al-Sarawi
7,733,076 B1 * 6/2010  Shirvani-Mahdavi ......................
                                    G05F 1/561
                                    323/312

(Continued)

FOREIGN PATENT DOCUMENTS

JP        2935781       8/1999
WO   WO 2013/034779 A1   3/2013
WO   WO 2016/064380 A1   4/2016

OTHER PUBLICATIONS

French Preliminary Search Report dated Jun. 21, 2018 in French Application 17 58491, filed on Sep. 13, 2017.

(Continued)

*Primary Examiner* — Kenneth B Wells
(74) *Attorney, Agent, or Firm* — Oblon, McClelland, Maier & Neustadt, L.L.P.

(57) ABSTRACT

An electronic device includes a reference resistor, two first terminals between which the reference resistor is connected, and two second terminals between which a modified impedance value of the reference resistor is intended to be obtained. The electronic device also includes a first circuit that applies between the two second terminals a voltage substantially equal to that between the two first terminals, and a second circuit that flows between the two second terminals a second current the value of which corresponds to a fraction of a first current for flowing in the reference resistor between the two first terminals.

15 Claims, 8 Drawing Sheets

(51) Int. Cl.
*H03H 11/46* (2006.01)
*H03F 3/70* (2006.01)

(52) U.S. Cl.
CPC ....... *H03H 11/53* (2013.01); *H03F 2200/129* (2013.01); *H03F 2200/144* (2013.01)

(56) References Cited

U.S. PATENT DOCUMENTS

| | | | |
|---|---|---|---|
| 8,344,793 B2 * | 1/2013 | Nadimpalli | G05F 3/242 327/534 |
| 2013/0069716 A1 | 3/2013 | Shiue et al. | |
| 2016/0020734 A1 | 1/2016 | Takase | |
| 2017/0070209 A1 | 3/2017 | Takase | |

OTHER PUBLICATIONS

Tajalli, A., et al. "Implementing ultra-high-value floating tunable CMOS resistors", Electronics Letters, 2008, vol. 44, Issue 5, pp. 349-350.

* cited by examiner

US 10,886,915 B2

DEVICE MODIFYING THE IMPEDANCE VALUE OF A REFERENCE RESISTOR

TECHNICAL FIELD AND PRIOR ART

The invention relates to a device modifying the impedance value of a reference resistor and outputting this modified impedance value. The invention is advantageously used to form a high value resistor (HVR) the impedance of which is for example higher than or equal to about 1 MΩ.

In the field of microelectronics, it is sometimes necessary to have a continuous time HVR. This is the case with a charge amplifier used for example in spectrometry to detect the electric signals created by the impact of photons in the detector. Such a charge amplifier 10 is shown in FIG. 1. The charge amplifier 10 includes an input 12 and an output 14 to which an integration capacitance 16 and an HVR 18, in parallel to the charge amplifier 10, are connected. The impedance value of the HVR 18 is for example in the order of 1 GΩ and that of the integration capacitance 16 in the order of a few tens of femtofarads (fF). The HVR 18 must have a low value stray capacitance (a few fFs, for example less than 10 fF) and negligible with respect to that of the integration capacitance 16, support a high tension variation (a few hundreds of mV) and have a noise density in accordance with physics, that is $\overline{e^2}=4\,k_B TR$, with $k_B$ the Boltzmann constant equal to $1.38 \cdot 10^{-23}$ J·K$^{-1}$ and T the temperature in Kelvins.

But, the impedances obtained with integrated physical resistors made either of high resistivity polycrystalline silicon, or as a well ("n-well resistor"), or even by diffusion, are in the order of 1 kΩ/square. These resistors thus form impedances with maximum values limited to a few hundreds of kΩ, that is less than 1 MΩ, because beyond this, the resistors have too high a size and have too high a stray capacitance.

Discrete time resistive devices, for example with switched capacitances, enable high impedance values to be reached. However, these devices are not adapted to form HVR resistors because of their too high switching noise.

Other solutions have also been proposed in documents U.S. Pat. No. 6,897,528 B2, US 2013/0069716 A1 and "Implementing ultra-high-value floating tunable CMOS resistors" by A. Tajalli et al., Electronics Letters, 2008, Volume 44, Issue 5, pages 349-350. Each of these solutions however has at least one of the following drawbacks: the voltage dynamics is too low (a few tens of mV at best), the equivalent noise is too high, the stray, or parasitic, capacitance is too high.

Other electronic devices having the behaviour of an electric resistor exist: long MOS transistor, feedback transconductance amplifier, positive impedance converter. But these devices do not enable all the characteristics of a true HVR to be obtained, namely:
high R value;
noise density of 4 $k_B$TR;
low stray capacitance;
frequency operation from continuous time;
large voltage swing (for example from 0.3 V to 1.2 V);
voltage independence (linearity);
low temperature sensitivity.

DISCLOSURE OF THE INVENTION

One purpose is thus to provide a device modifying the impedance value of a reference resistor not having the drawbacks of prior art set out above, namely enabling impedance values higher than or equal to about 1 MΩ to be reached and that can exceed at least 1 GΩ, operating in continuous time and having the same properties as a physical resistor.

For this, it is provided an electronic device including at least:
a reference resistor;
two first terminals between which the reference resistor is connected, or coupled, and two second terminals between which a modified impedance value of the reference resistor is intended to be obtained;
a first circuit able to, or configured to, apply between the two second terminals a voltage substantially equal to that between the two first terminals;
a second circuit able to, or configured to, flow between the two second terminals a second current the value of which corresponds to a fraction of a first current for flowing in the reference resistor between the two first terminals.

In this device, the impedance value of the reference resistor is modified by virtue of the second current imposed between the two second terminals and the value of which corresponds to a fraction of that of the first current. Because the voltage between the two second terminals is substantially similar to that between the two first terminals, the impedance value between the two second terminals is actually modified with respect to that of the reference resistor. For example, by having a first current $i_0$ and a second current $i_1$ the value ratio of which is $i_1/i_0 = 1/K$, the ratio of the impedance value obtained between the two second terminals to that of the reference resistor is equal to K.

This device has the attempted properties, namely:
an impedance between the two second terminals which can be of a very high value (for example higher than or equal to about 1 GΩ), by virtue of the multiplicative factor applied to the value of the reference resistor,
a good linearity,
a great voltage dynamics (the voltage swing obtained between the two second terminals can come closer to the value of the supply voltage of the electronic device),
a thermal noise equivalent to that of a physical resistor of a same value,
very low stray capacitance (for example in the order of 0.5 fF),
a frequency operation from a DC voltage,
a proper temperature resistance,
a dispersion sensitivity in accordance with that of the technological components used in the electronic device (for example: MOS transistors, resistors),
1/f noise due for example to the MOS transistors of the device,
an occupied area in the order of a few hundreds of μm$^2$ (for example less than 1 mm$^2$),
a consumption equal to a few tens of μW (for example less than 100 μW).

A second current with the value i1 corresponding to a fraction of the value i0 of a first current is such that the values verify the relationship i1/i0<1.

The second circuit may include at least one first FET transistor the source and drain of which are each connected, or coupled, to one of the two second terminals and the gate of which is able, or configured, to receive an electric potential from the second circuit and the value of which depends on that of the first current. The value of the electric potential applied to the gate of the first FET transistor may be controlled by the current flowing through the reference resistor. The value of the current flowing through the first FET transistor (drain-source current) being controlled by the value of the potential applied to the gate of the first FET transistor, this current flowing through the first FET transistor thus has a value proportional to that of the current flowing through the reference resistor.

In addition, the second circuit may include at least:
- a first current mirror comprising at least the first FET transistor and a second FET transistor;
- a second current mirror comprising at least third and fourth FET transistors;

wherein the first and second FET transistors may be of a different type from that of the third and fourth FET transistors, and wherein the first and second FET transistors may have channels with dimensions different from each other and/or the third and fourth FET transistors may have channels with dimensions different from each other.

The second circuit uses judiciously in this case the property of current mirrors of repeating a current by applying a multiplication or division factor to the value of this current, this factor being defined by the dimension ratio of the transistor channels of the current mirror. By differently dimensioning the FET transistors of at least one of the first and second current mirrors, a multiplication or division factor defined by the different dimension ratio of the channels of this (these) current mirror(s) is thus applied to the first current, which defines the value of the second current.

By multiplying the number of current mirrors used to form the second circuit, an important multiplication factor K (between the impedance value of the reference resistor and that of the device between the two second terminals) can be readily obtained without occupying a high area.

Regardless of the number of current mirrors forming the second circuit, these mirrors may be electrically connected, or coupled, to each other in series such that the multiplication or division factors on the value of the current passing through these current mirrors are cumulated. This is also applicable to all the embodiments being described.

Further, the device may be such that:
- the drain of the fourth FET transistor is connected, or coupled, to one of the two first terminals;
- the drain of the third FET transistor is connected, or coupled, to the drain of the second FET transistor;
- the source of the second FET transistor is connected, or coupled, to the other of the two first terminals.

The second circuit may further include at least one third current mirror interposed between the drain of the third FET transistor and the drain of the second FET transistor. Thus, a further multiplication or division factor, defined by the dimension ratio of the channels of the FET transistors of this third current mirror, is added to those of the first and second current mirrors.

The first circuit may include at least one first operational amplifier comprising a first input connected, or coupled, to one of the two first terminals, a second input connected, or coupled, to one of the two second terminals, and an output connected, or coupled, to the second circuit. This first operational amplifier ensures repeating of the electric potential of one of the two first terminals to one of the two second terminals.

The first circuit may further include a second operational amplifier comprising an input connected, or coupled, to the other of the two second terminals and an output connected, or coupled, to the other of the two first terminals, or the other of the two first terminals may be connected, or coupled, to the other of the two second terminals. Either of both configurations enables the electric potential of the other of the two first terminals to be repeated to the other of the two second terminals.

The device may further include, when the second circuit includes current mirrors, a fourth circuit able, or configured, to modify the dimension ratios of the transistor channels of at least one of the current mirrors. Such a fourth circuit can for example include switches making possible to choose among several transistors with different dimensions those which will form the current mirror.

The device may further include at least two resistors forming a voltage dividing bridge, the reference resistor being connected, or coupled, in parallel to one of the two resistors of the voltage dividing bridge. Thus, the multiplication ratio K between the impedance value of the reference resistor and that of the device between the two second terminals is readily increased by virtue of the voltage dividing bridge.

It is also provided an electronic circuit including at least:
- a charge amplifier;
- an integration capacitance connected, or coupled, in parallel to the charge amplifier, between an input and an output of the charge amplifier;
- a device, as defined above, connected, or coupled, in parallel to the charge amplifier, the second terminals of the device being connected, or coupled, to the input and output of the charge amplifier.

It is also provided an electronic circuit including at least:
- a charge amplifier;
- a first integration capacitance connected, or coupled, in parallel to the charge amplifier, between an input and an output of the charge amplifier;
- a fifth FET transistor connected, or coupled, in parallel to the charge amplifier, the source and drain of the fifth FET transistor being connected, or coupled, to the input and output of the charge amplifier;
- several sixth FET transistors each having their drain connected, or coupled, to the output of the charge amplifier through a switch;
- several second integration capacitances each connected, or coupled, in parallel to one of the sixth transistors;
- at least one electronic device as defined above and wherein the second circuit includes at least one first FET transistor the source and drain of which are each connected, or coupled, to one of the two second terminals and the gate of which is able, or configured, to receive an electric potential from the second circuit and the value of which depends on that of the first current;
- and wherein the fifth and sixth FET transistors are connected, or coupled, to the gate of the first FET transistor.

BRIEF DESCRIPTION OF THE DRAWINGS

The present invention will be better understood upon reading the description of exemplary embodiments given by way of purely indicating and in no way limiting purposes making reference to the appended drawings in which.

Identical, similar or equivalent parts of the different Figs. described hereinafter bear the same reference numerals so as to facilitate switching from one Fig. to the other.

The different parts shown in the Figs. are not necessarily drawn to a uniform scale, to make the Figs. more readable.

The different possibilities (alternatives and embodiments) should be understood as being non-exclusive to each other and can be combined to each other.

DETAILED DISCLOSURE OF PARTICULAR EMBODIMENTS

Figure 2:
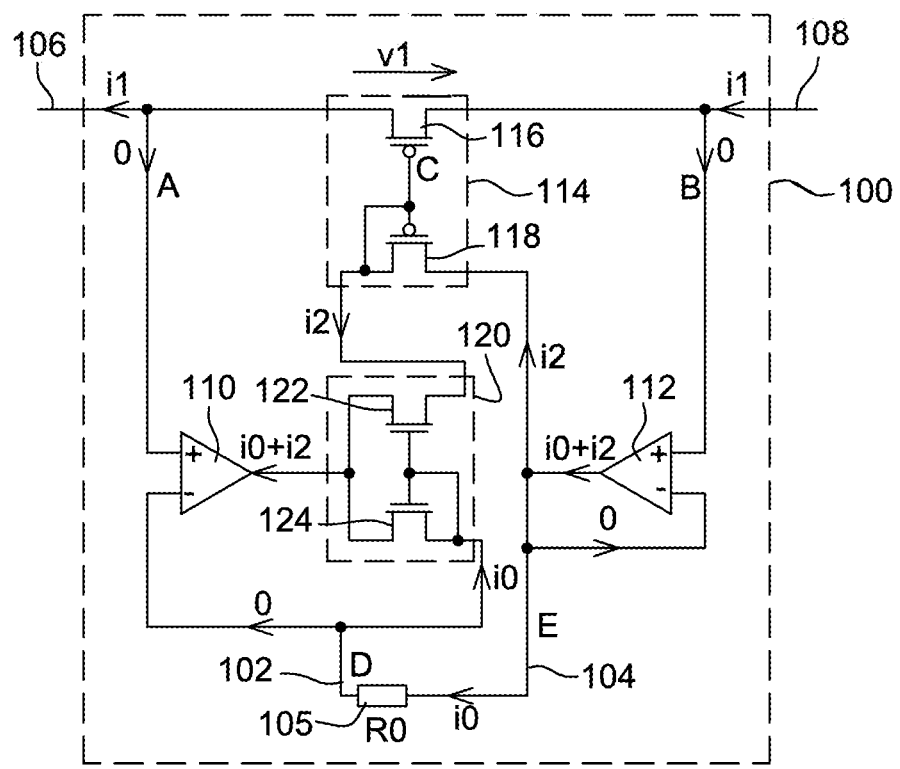
FIGS. 2-8 show several embodiments and alternative embodiments of an electronic device.

FIG. 2 shows an electronic device 100 according to a first embodiment, enabling the impedance value of a reference resistor 105 to be modified.

The device 100 includes two first terminals 102, 104 to which the reference resistor 105 is connected. An electric potential $V_D$ is intended to be obtained on the terminal 102 and an electric potential $V_E$ is intended to be obtained on the terminal 104. The reference resistor 105 has an impedance with the value $R_0$ and is such that a current $i_0$ passes therethrough because of a voltage $V_{DE}$ applied between both first terminals 102, 104 and to which the reference resistor 105 is subjected.

The device 100 also includes two second terminals 106, 108 between which a modified impedance value of the reference resistor 105 is intended to be obtained. An electric potential $V_A$ is intended to be obtained on the terminal 106 and an electric potential $V_B$ is intended to be obtained on the terminal 108. The device 100 is such that a current $i_1$ passes therethrough, via the second terminals 106, 108.

The device 100 includes a first operational amplifier 110 having its non-inverting input connected to the terminal 106, and thus to the electric potential $V_A$, and its inverting input connected to the terminal 102 and thus to the electric potential $V_D$.

The device 100 includes a second operational amplifier 112 including its non-inverting input connected to the terminal 108, and thus to the electric potential $V_B$, and its inverting input connected to the terminal 104 and thus to the electric potential $V_E$.

The output of the second operational amplifier 112 is directly connected to its inverting input, thus forming a follower connection, as well as to the input of a first current mirror 114 formed by a first FET transistor 116 and a second FET transistor 118. This first current mirror outputs the current $i_1$. The first and second FET transistors 116, 118 are here of the P type.

The output of the first operational amplifier 110 is connected to a second current mirror 120 for receiving as an input the current $i_0$ and outputting a current $i_2$ the value of which is a function of the dimension ratio of the third and fourth FET transistors 122, 124 forming the second current mirror 120. The third and fourth FET transistors 122, 124 are of the type opposite to that of the first and second FET transistors 116, 118, that is herein of the N type.

The first operational amplifier 110 has its output connected to the sources of the third and fourth FET transistors 122, 124, providing the sum of the currents $i_0$ and $i_2$ to the sources of the third and fourth FET transistors 122, 124.

The drain of the fourth FET transistor 124 is connected to the terminal 102 as well as to the gates of the third and fourth FET transistors 122, 124. The drain of the third FET transistor 122 is connected to the drain of the second FET transistor 118, thus connecting the first and second current mirrors 114, 120 to each other. The first and second current mirrors 114, 120 can be seen as being connected in series to each other. The drain of the second FET transistor 118 is connected to the gates of the first and second FET transistors 116, 118. The drain of the first FET transistor 116 is connected to the terminal 106 and the source of the first FET transistor 116 is connected to the terminal 108.

Within the device 100, the operational amplifiers 110, 112 form a first circuit configured to apply between the two second terminals 106, 108 a voltage substantially equal to that between the two first terminals 102, 104. The first operational amplifier 110 ensures equality of the values of the electric potentials $V_A$ and $V_D$. Likewise, the second operational amplifier 112 ensures equality of the values of the electric potentials $V_B$ and $V_E$. This first circuit thus makes it possible to have:

$$V_{AB} = V_{DE} = R_0 \cdot i_0 \quad (1)$$

with $R_0 \cdot i_0$ corresponding to the voltage across the reference resistor 105.

The device 100 shown in FIG. 2 is adapted to operate with $V_B > V_A$. In this case, the current mirrors 114 and 120 are such that the first and second transistors 116, 118 forming the first current mirror 114 are of the P type, and that the third and fourth transistors 122, 124 forming the second current mirror 120 are of the N type.

The current mirrors 114, 120 form together a second circuit configured to flow between the two second terminals 106, 108 the current $i_1$ the value of which corresponds to a fraction (or possibly a multiple) of the current $i_0$. Indeed, the values of the currents $i_0$, $i_2$ and $i_1$ are related to each other by the dimension ratios of the FET transistors forming each of the current mirrors 114, 120. Thus, the relationship relating the values of the currents $i_0$ and $i_2$ is:

$$i_0 = k_2 \cdot i_2 \text{ with } k_2 = (W_{124}/W_{122}) \cdot (L_{122}/L_{124}) \quad (2)$$

with $W_{122}$ the channel width of the third transistor 122, $W_{124}$ the channel width of the fourth transistor 124, $L_{122}$ the channel length of the third transistor 122, and $L_{124}$ the channel length of the fourth transistor 124.

By making the third and fourth transistors 122, 124 with channels with lengths equal to each other, the relationship (2) relating the values of the currents $i_0$ and $i_2$ then becomes:

$$i_0 = k_2 \cdot i_2 = (W_{124}/W_{122}) \cdot i_2 \quad (3).$$

Further, the relationship relating the values of the currents $i_2$ and $i_1$ is:

$$i_2 = k_1 \cdot i_1, \text{ and } k_1 = (W_{118}/W_{116}) \cdot (L_{116}/L_{118}) \quad (4)$$

with $W_{116}$ the channel width of the first transistor 116, $W_{118}$ the channel width of the second transistor 118, $L_{116}$ the channel length of the first transistor 116, and $L_{118}$ the channel length of the second transistor 118.

By making the first and second transistors 116, 118 with channels with lengths equal to each other, the relationship (4) between the currents $i_2$ and $i_1$ then becomes:

$$i_2 = k_1 \cdot i_1 = (W_{118}/W_{116}) \cdot i_1 \quad (5).$$

Thus, with transistors 116, 118, 122 and 124 all having channels with the same length, the relationship between the currents $i_0$ and $i_1$ is thus:

$$i_0 = k_1 \cdot k_2 \cdot i_1 = (W_{118}/W_{116}) \cdot (W_{124}/W_{122}) \cdot i_1 = K \cdot i_1 \quad (6).$$

With $V_1$ the voltage between the source and drain of the first transistor 116 and $i_1$ the current flowing between the second terminals 106 and 108, the resistor $R_{AB}$ is such that:

$$R_{AB} = V_1/i_1 = V_{AB}/i_1 \quad (7).$$

Because the potential $V_A$ is equal to the potential $V_D$ and that the potential $V_B$ is equal to the potential $V_E$, and by considering the equations (6) and (7) above, $R_{AB}$ is such that:

$$R_{AB} = V_{ED} \cdot 1 < /i_0 = K \cdot R_0 \tag{8}$$

Thus, the device 100 makes it possible to have between the two second terminals 106, 108 an impedance with a value equal to that of the resistor $R_0$ multiplied by the factor K.

Advantageously, by choosing a reference resistor 105 having a high impedance, for example equal to 100 kΩ, and by dimensioning the channels of the FET transistors of the current mirrors 114, 120 such that $k_1 = k_2 = 100$, the device 100 enables a HVR resistor, to be formed the impedance of which is for example $R_0 = 1$ GΩ.

Figure 3:
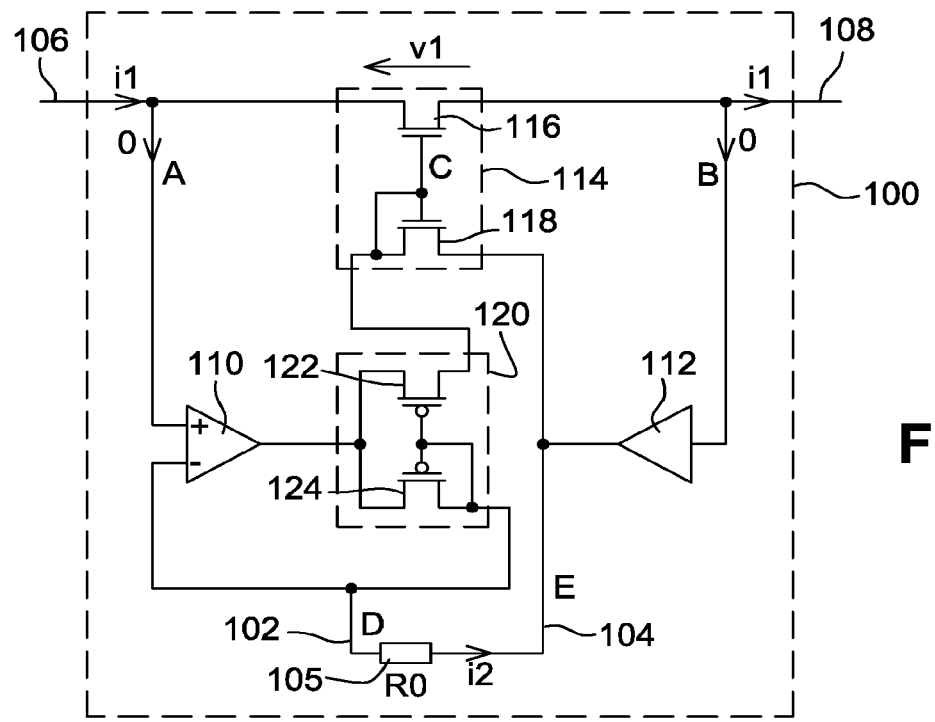

FIG. 3 shows a device 100 for modifying an impedance according to a second embodiment.

The device 100 according to this second embodiment includes the same elements as those of the device 100 according to the first embodiment shown in FIG. 2, that is the operational amplifiers 110, 112 (in FIG. 3, a single input of the amplifier 112 which is connected as a follower is shown, this single input corresponding to the non-inverting input of the operational amplifier 112) and the current mirrors 114, 120 formed by the FET transistors 116, 118, 122 and 124. Unlike the first embodiment, the FET transistors 116, 118 are here of the N type and the FET transistors 122, 124 are of the P type. By thus inverting the polarity of the FET transistors, the device 100 shown in FIG. 3 is adapted to operate with $V_B < V_A$. The operation of this device 100 is analogous to that previously described in connection with FIG. 2.

According to another embodiment, in order to have a device for modifying the impedance value of the reference resistor 105 operating independently of the values of the electric potentials $V_A$ and $V_B$ (that is both with $V_A < V_B$ and $V_A > V_B$), it is possible to connect the components of both devices 100 with opposite polarities to each other (one corresponding to that shown in FIG. 2 and the other corresponding to that shown in FIG. 3) at their terminals 106, 108. Thus, depending on the sign of the voltage $V_{AB}$, the components of either of both devices 100 enable the modified impedance value between the terminals 106, 108 to be obtained. Such a device can be provided with switches connecting the components of either of both devices 100 to the terminals 106, 108 depending on the sign of the voltage $V_{AB}$.

According to another embodiment making it possible to have a device for modifying the impedance value of the reference resistor 105 operating independently of the values of the electric potentials $V_A$ and $V_B$, this device can correspond to one of both devices 100 shown in FIGS. 2 and 3, and further include two other current mirrors complementary to the current mirrors 114, 120. The device 100 also includes in this case switches enabling the terminals 106, 108, the operational amplifiers 110, 112 and the reference resistor 105 to be connected either to the current mirrors 114, 120, or to the complementary current mirrors depending on the sign of the voltage $V_{AB}$. The switches of such a device 100 make it possible to switch from the configuration shown in FIG. 2 to that shown in FIG. 3 without having to duplicate all the components of the device 100.

Figure 4:
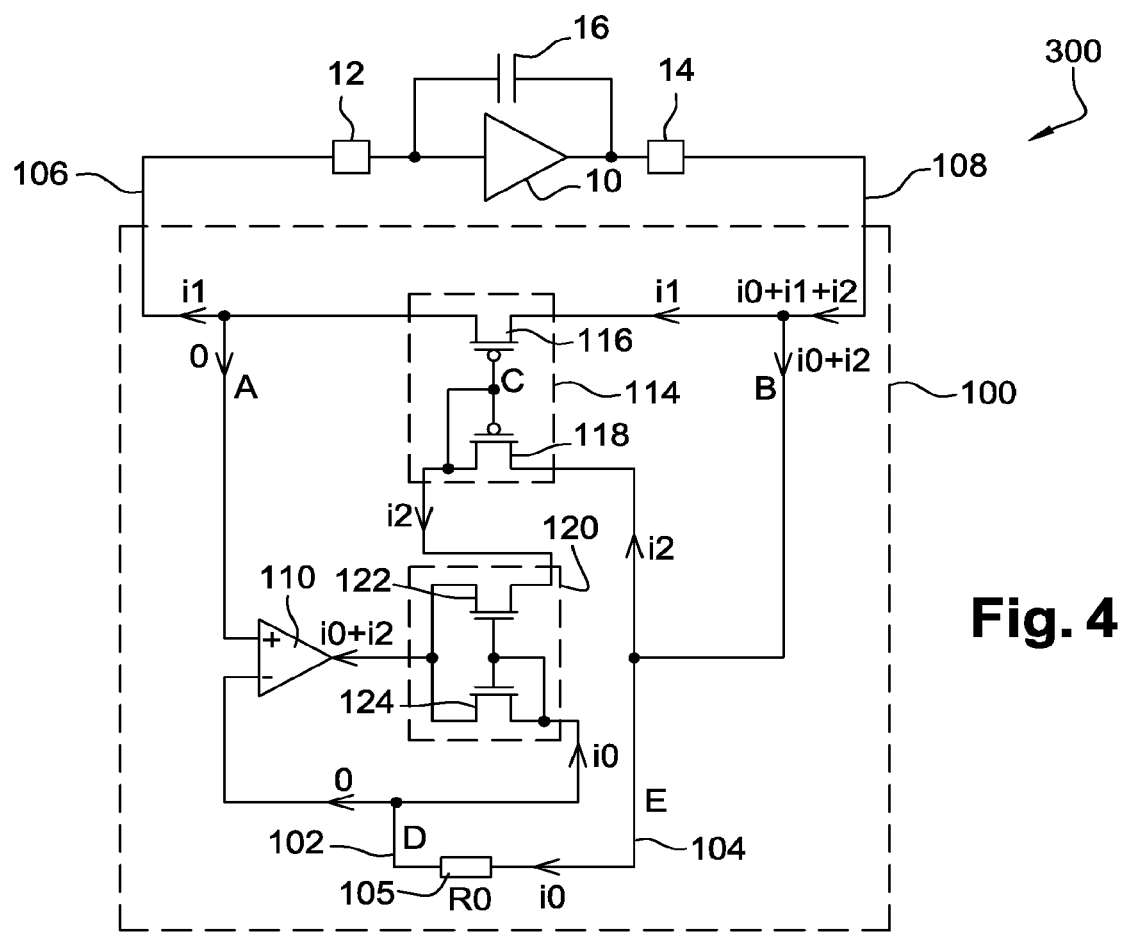

In some cases, for example if the device 100 is feedback connected to a charge amplifier, the low-impedance output of the charge amplifier is thereby able to provide the current $i_0 + i_2$ required for operating the device 100. In this case, the device 100 may not include the operational amplifier 112, with therefore the reference resistor 105 directly connected to the drains of the FET transistors 116, 118 of the first current mirror 114. FIG. 4 shows an electronic circuit 300 including the device 100 according to a third embodiment which corresponds to the configuration described above, that is feedback connected to the charge amplifier 10 (here in a configuration similar to that of that previously described in connection with FIG. 1). The terminal 104 is directly connected to the drains of the FET transistors 116, 118 of the first current mirror 114 as well as to the terminal 108.

Further, in the configuration shown in FIG. 4, the electric potentials $V_B$ and $V_A$ are permanently such that $V_B > V_A$. Thus, adding further components to ensure operation of the device 100 when $V_B < V_A$ is not necessary.

Figure 5:
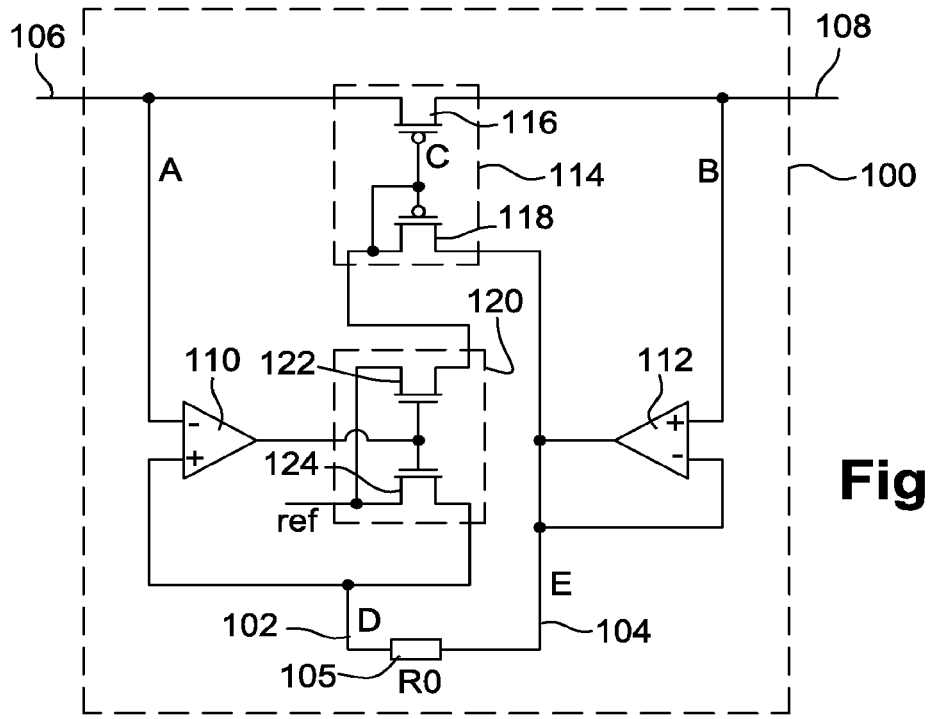

FIG. 5 shows the device 100 for modifying an impedance according to a fourth embodiment.

This device 100 includes the same components as those of the device 100 according to the first embodiment. On the other hand, in this fourth embodiment:

the drain of the fourth FET transistor 124 is disconnected from the gates of the third and fourth FET transistors 122, 124;

the sources of the FET transistors 122, 124 of the second current mirror 120 are not connected to the output of the operational amplifier 110 but are connected to a reference electric potential, which can correspond for example to the supply potential or the ground of the device 100;

the output of the operational amplifier 110 is connected to the gates of the FET transistors 122, 124 of the second current mirror 120;

the connections to the inputs of the operational amplifier 110 are switched over (with respect to the configuration according to the first embodiment) in order to ensure the feedback phase.

In comparison with the first embodiment, this device 100 according to this fourth embodiment has the advantage of having a little more significant operational dynamics.

These differences between the fourth and first embodiments can also be applied for the second embodiment, that is in the case where the FET transistors 122, 124 are of the P-type and the FET transistors 116, 118 are of the N type.

In the previous embodiments, the device 100 includes an even number of current mirrors. According to another embodiment, the device 100 can include an odd number of current mirrors. In this case, in comparison with the previously described devices 100 including two current mirrors, the device 100 includes at least one further amplifier connected as a follower. The device 100 shown in FIG. 6 corresponds to such an embodiment, named a fifth embodiment.

Figure 6:
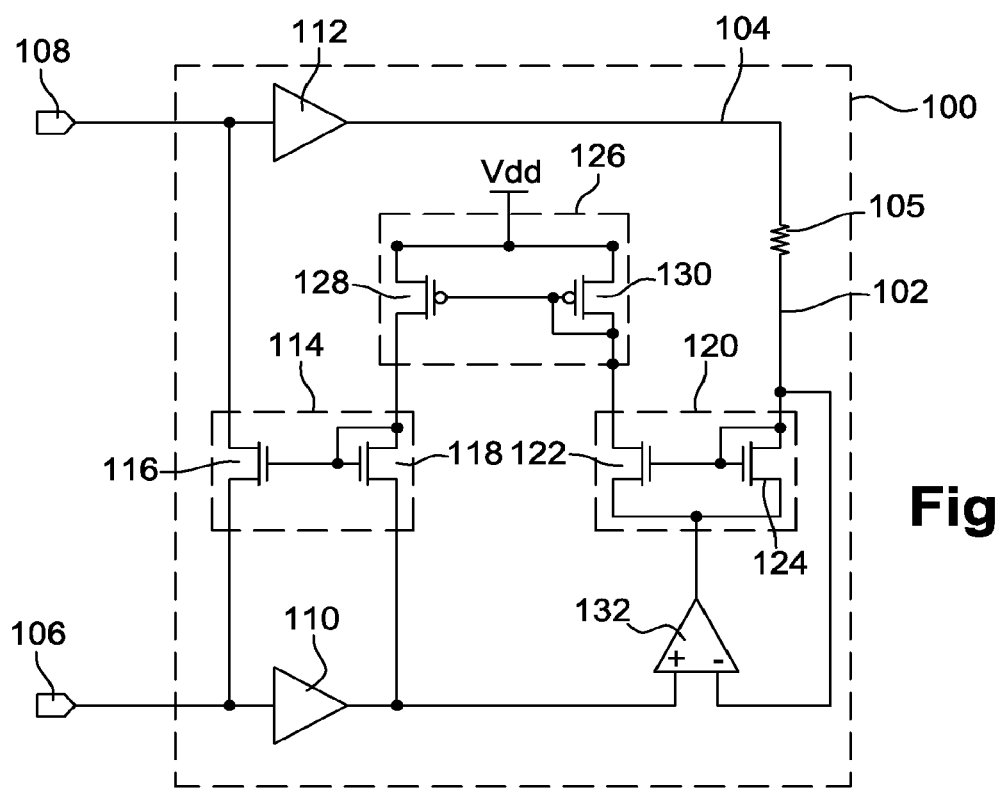

In FIG. 6, the device 100 includes, in addition to the two current mirrors 114, 120 (which here both include N-type FET transistors), a third current mirror 126 formed by two FET transistors 128, 130, here of the P type. This third current mirror 126 is interposed between both current mirrors 114, 120, the drain of each of the FET transistors 128, 130 being connected to one of both current mirrors 114, 120. In this configuration, the current mirrors 114, 120, 126 can be seen as being electrically connected to each other in series. The sources of the FET transistors 128, 130 of the third current mirror 126 are herein directly connected to the supply potential Vdd of the device 100. Further, this device 100 includes a further operational amplifier 132 connected as a follower and interposed between the amplifier 110 and the current mirror 120.

In the configuration shown in FIG. 6, the dimension ratio of the FET transistors 128, 130 of the current mirror 126 is cumulated to those of the transistors of the current mirrors 114, 120, thereby increasing the impedance transformation ratio made by the device 100. In the exemplary embodiment shown in FIG. 6, the dimension ratio of the transistors of each of the current mirrors 114, 120, 126 is equal to 10, which enables a resistor $R_{AB}=10^3 R_0$ to be obtained between the terminals 106 and 108. For example, with a reference resistor 105 with a value $R_0=100$ kΩ, the impedance obtained with the device 100 is $R_{AB}=100$ MΩ.

According to one alternative, the N or P types of the transistors of the current mirrors 114, 120, 126 can be reversed with respect to the configuration described above.

Regardless of whether the device 100 includes an even or odd number of current mirrors, the device 100 can include more than 2 or 3 current mirrors. Indeed, a higher number of current mirrors enables either the multiplication factor of the impedance value to be increased by the device 100, or, for a given multiplication factor, the overall dimensions of the current mirrors to be reduced by reducing the dimensions and/or the number of FET transistors within the current mirrors. The device 100 shown in FIG. 7 corresponds to such an embodiment, named a sixth embodiment.

Figure 7:
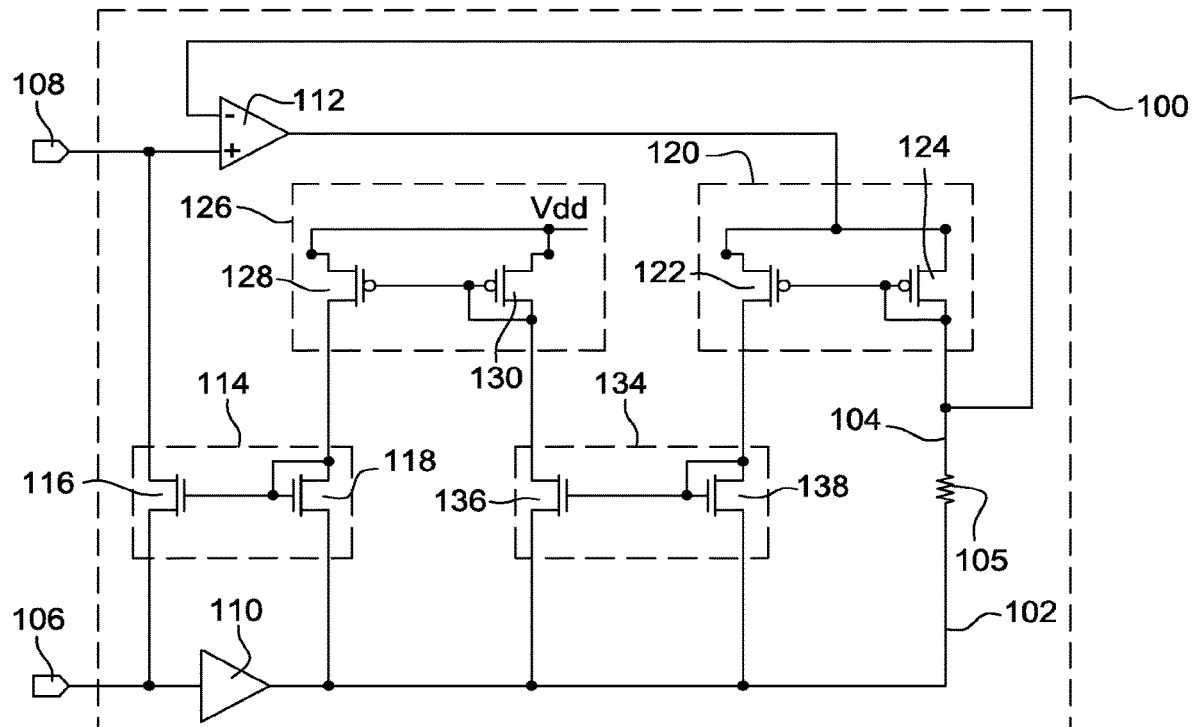

In FIG. 7, the device 100 includes four current mirrors 114, 120, 126, 134, two of the four current mirrors 120, 126 comprising P-type FET transistors 122, 124, 128, 130, the two other current mirrors 114, 134 comprising N-type FET transistors 116, 118, 136, 138. The current mirrors 114, 120, 126, 134 are electrically connected to each other such that the dimension ratios of the transistors of the current mirrors 114, 120, 126, 134 are cumulated and thus enable a larger multiplication factor of the value $R_0$ of the reference resistor 105 or a reduction in the dimensions of the current mirrors to be obtained for a given multiplication factor. The sources of the FET transistors 128, 130 of the current mirror 126 are electrically connected to the supply electric potential Vdd of the device 100.

By way of example, by making each of the current mirrors such that the width ratio of the transistors of each of the current mirrors is 10, it is possible to obtain, from a reference resistor 105 with $R_0=100$ kΩ, an impedance $R_{AB}=1$ GΩ by virtue of the multiplicative factor K=10000 which is obtained. In comparison with a device 100 having the same multiplicative factor K but made with only two current mirrors, the area occupied by the four current mirrors of this device 100 is about 5 times lower than that occupied by two current mirrors.

Figure 8:
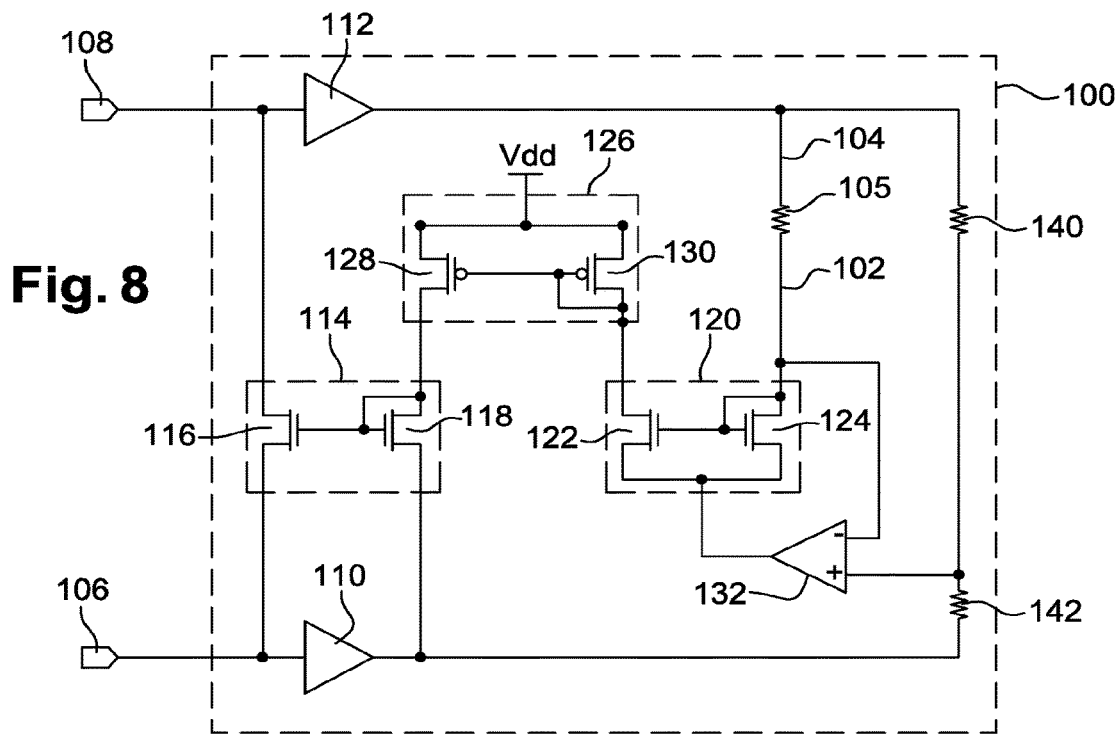

A device 100 according to a seventh embodiment is shown in FIG. 8. This device 100 includes all the elements previously described in connection with the device 100 of FIG. 6, that is the three current mirrors 114, 120, 126 and the three amplifiers 110, 112, 132. In addition to these elements, the device 100 according to this seventh embodiment includes two resistors 140, 142 forming a voltage dividing bridge, enabling the value of the voltage applied to the terminals of the reference resistor 105 to be modified. In FIG. 8, the setpoint applied to the positive input of the amplifier 132 corresponds to a fraction of the voltage $V_{AB}$. Thus, the voltage $V_{ED}$ applied to the terminals of the reference resistor 105 is:

$$V_{ED}=(V_B-V_A) \cdot R_{140}/(R_{140}+R_{142}) \quad (9)$$

with $R_{140}$ the impedance value of the resistor 140 and $R_{142}$ the impedance value of the resistor 142.

Thus, the current $i_0$ is thereby reduced in the proportion $R_{140}/(R_{140}+R_{142})$ and the resistor $R_{AB}$ is thus increased by the ratio $(R_{140}+R_{142})/R_{140}$.

By way of example, the value of the resistor $R_{140}$ can be 50 kΩ and that of the resistor $R_{142}$ can be 150 kΩ. Thus, the resistor $R_{AB}$ is increased by a factor 4, and switching for example from the value 100 MΩ to 400 MΩ.

The value of the resistor $R_{AB}$ can also be modified by other means. For example, it is possible that the device 100 includes switches (for example formed by transistors) enabling one or more further resistors to be connected in series or parallel to the reference resistor 105. It is also possible to have switches enabling to choose, from several reference resistors with different values, that which will be connected to other elements of the device 100.

Such switches can also be used to connect, within the current mirrors, different N- or P-type transistors, which enables these transistors to be connected to each other or not to form the current mirrors. With transistors having different widths, it is thus possible to modify the ratio value between the currents passing through the current mirrors, which changes the impedance multiplication factor, depending on the control signals received by the switches.

Figure 9:
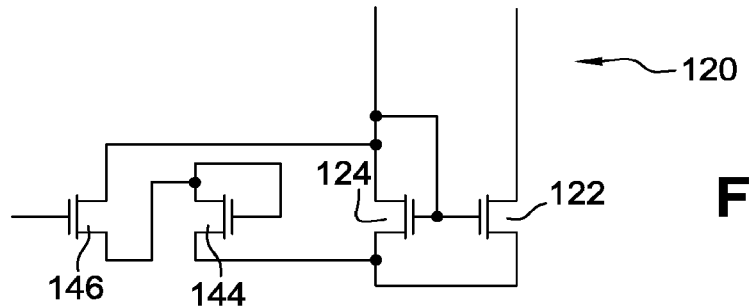
FIG. 9 shows a current mirror having one of its transistors with a variable width.

It is also possible, for one or more of the current mirrors of the device 100, to have one or more transistors arranged in parallel to this current mirror and the connection with the current mirror of which is controlled by a switch. FIG. 9 shows for example the current mirror 120 including a transistor 144 that can be connected or not in parallel to the transistor 124 depending on the ON or OFF state of a control transistor 146. When the transistor 144 is connected in parallel to the transistor 124, the widths of the transistors 144 and 124 are added, thus modifying the ratio between the currents flowing in the two branches of the current mirror 120.

Further, the gate of the transistor 116, the source and drain of which are connected to the terminals 106 and 108, can be connected to gates of other FET transistors homothetic to the transistor 116 and the drains of which are connected to the terminal 108 and the sources of which are connected to a node brought to the same potential $V_A$.

The performance obtained with a device 100 similar to that shown in FIG. 3 is described below. This device 100 is made with a 130 nm CMOS technology and supplied with a +1.2 V voltage. The reference resistor 105 used has the value $R_0=100$ kΩ and the transistors 116, 118, 122 and 124 are dimensioned such that within each of the current mirrors 114, 120, the dimension ratio between the transistors is 100, which enables the device 100 to have a multiplicative factor for the value $R_0$ equal to 10000. The nominal value of the resistor $R_{AB}$ obtained between the terminals 106 and 108 is thus equal to 1 GΩ.

Figure 10:
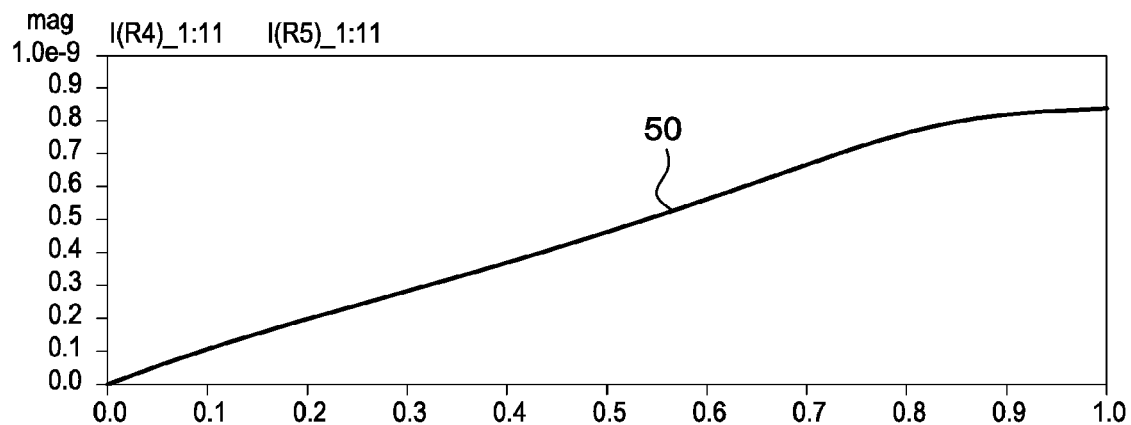
FIGS. 10 to 13 show simulation results obtained from an electronic device.
Figure 10:
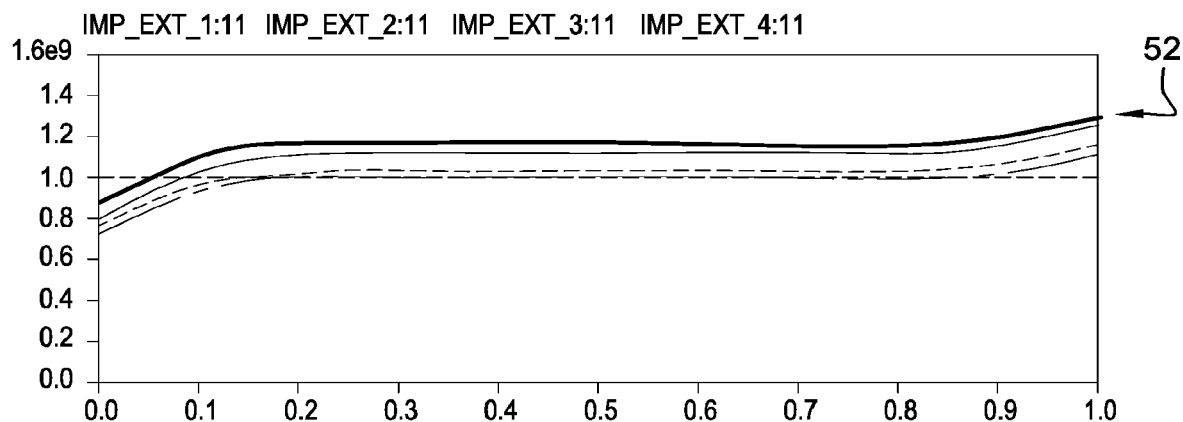

The curve 50 visible in FIG. 10 shows the nominal current $i_1$ obtained depending on the value of the voltage $V_{AB}$. The curves 52 represent the impedance $R_{AB}$ obtained by Monte Carlo simulation. These simulations are made with a direct current supply. These curves show that the nominal value of the resistor $R_{AB}$ is maintained between about $V_{AB}=0.1$ V and $V_{AB}=0.9$ V. The variations obtained on the Monte Carlo simulation with respect to the nominal value, in the order of 20%, are related to dispersions of components (FET transistors and reference resistor 105).

Figure 11:
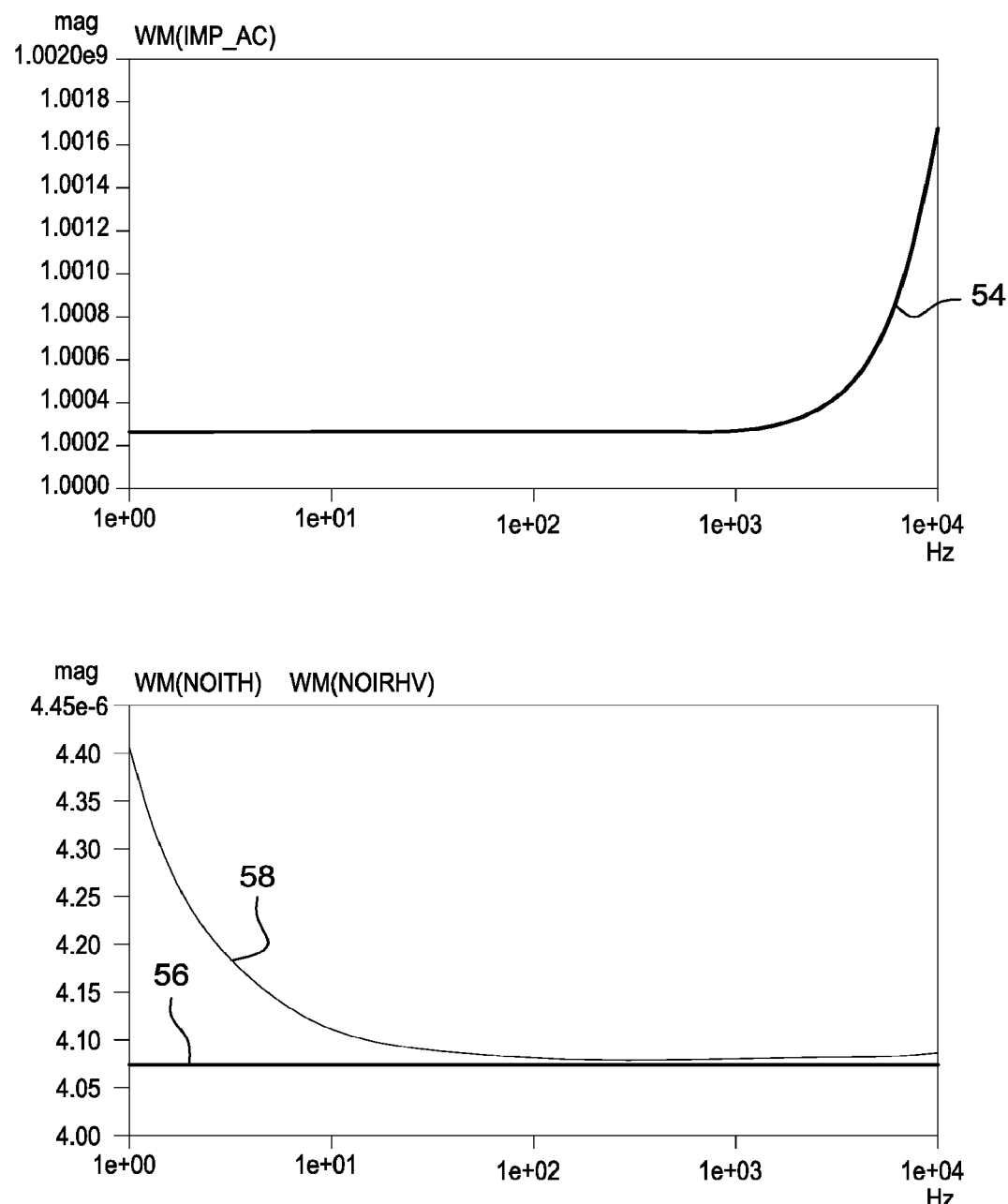

The curves 54, 56 and 58 visible in FIG. 11 result from an alternative current simulation from 1 Hz to 1 kHz at T=300 K. The curve 54 corresponds to the impedance obtained at an operating point chosen such that $R_{AB}=1002$ MΩ. The curve 56 represents the theoretical noise density of a resistor of 1 GΩ, that is 4.07 µV/Hz$^{1/2}$. The curve 58 represents the noise density obtained with the resistor R$_{AB}$, which is 4.08 µV/Hz$^{1/2}$, which is very close to the theoretical value. The curve 58 shows that a rise in the low frequency noise is obtained, because of the 1/f noise of the FET transistors.

Figure 1:
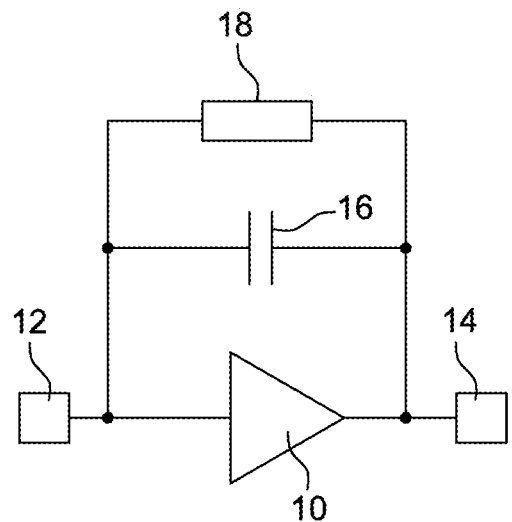
FIG. 1 shows a charge amplifier coupled to an HVR resistor.
Figure 12:
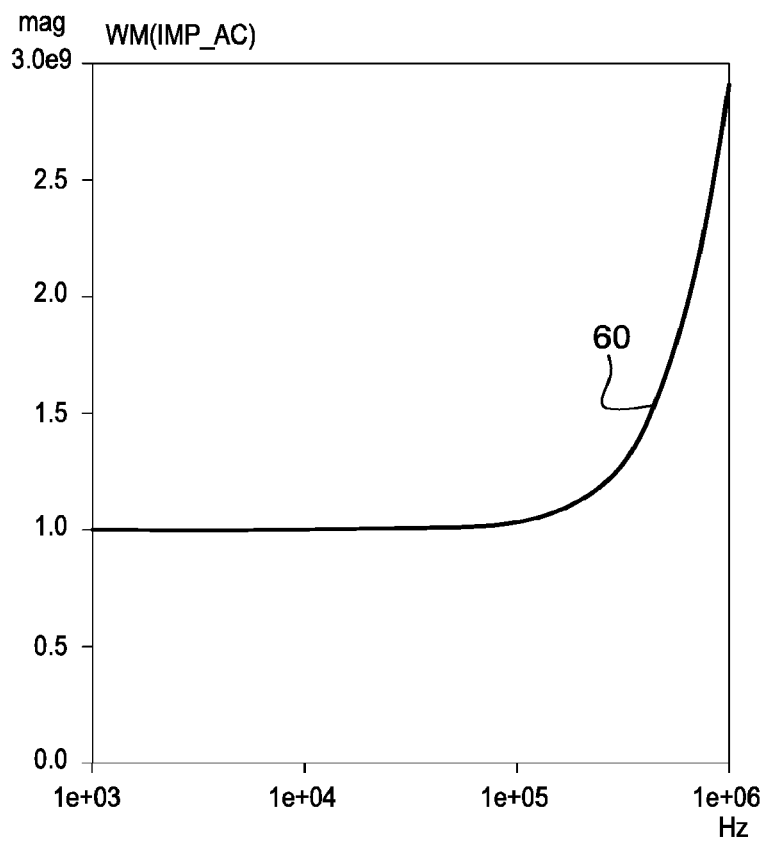

The curve 60 visible in FIG. 12 represents the impedance of the device 100 between 1 kHz and 1 MHz. This curve 60 shows a −3 dB cut-off frequency at 400 kHz caused by the inner poles of the device 100 and due to the effect of the capacitances of the FET transistors and of the reference resistor 105. Given the resistor R$_{AB}$, the stray capacitance Cp as a function of the frequency frq is thus Cp=1/(2πR$_{AB}$frq) =0.4 fF, which is an admissible value for a use of the device 100 as an HVR as shown in FIG. 1.

Figure 13:
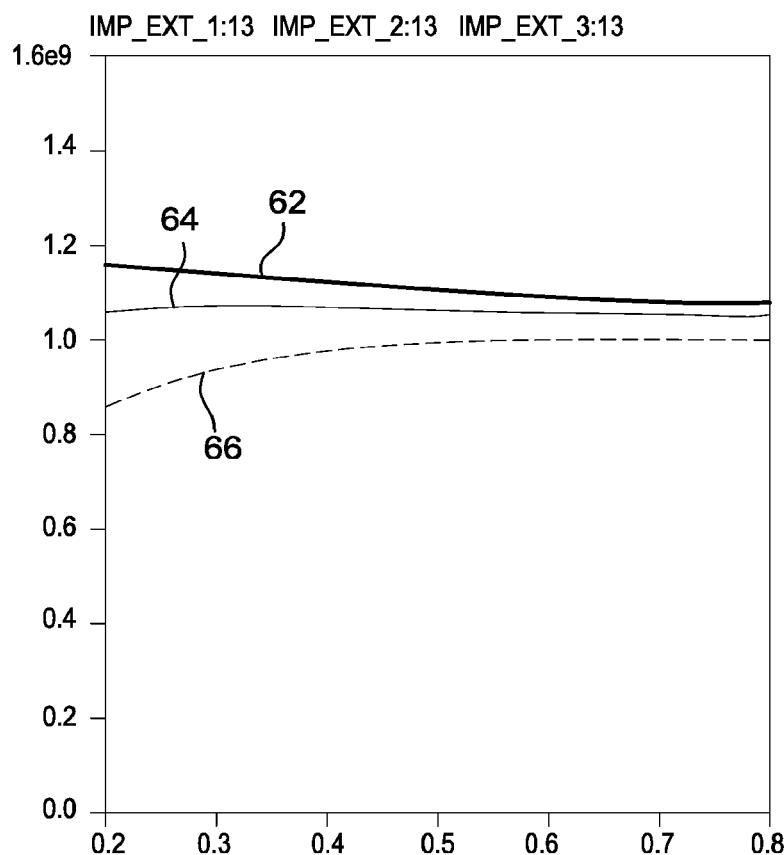

The curves 62, 64 and 66 visible in FIG. 13 represent the variations in the resistor R$_{AB}$ obtained as a function of the temperature (curve 62: 50° C.; curve 64: 27° C.; curve 66: 0° C.), and as a function of the value of the voltage V$_{AB}$. These variations are lower than +/−20% in the voltage range 0.2 V-0.8 V, and are related to the drifts of the components of the device 100. These variations can be reduced by choosing components having low drift with respect to the temperature, and/or by making a compensation for these variations.

The transistors of the device 100 are of the FET type, for example MOSFETs or JFETs.

In each of the current mirrors of the device 100, the equality between the gate-source voltages of the FET transistors of the current mirror can be achieved by virtue of physical connections (gates of the transistors which are electrically connected to each other and sources of the transistors which are electrically connected to each other) or by potential report (virtual ground).

Further, the current mirrors of the device 100 can include two transistors as in the embodiments previously described, or a greater number of transistors, for example 3 or 4 transistors (cascode, Wilson connection, etc.) or even more, which enables the characteristics and operating zone of the current mirrors to be improved, in particular during an operation under a very low voltage.

Advantageously, making FET transistors with different widths to form a current mirror can consist in making an elementary transistor with a channel having dimensions W/L, for example W/L=1 µm/1 µm, and repeating this elementary transistor several times to form a transistor having a channel with a larger width. For example, to form a current mirror comprising two FET transistors the width ratio of the channels is 100, it is possible to make an array of 101 elementary FET transistors, 100 of these transistors being used to form together a first of both transistors of the current mirror, and the last elementary transistor (advantageously arranged in the centre of the array to minimise technological dispersions) forming the second of both transistors of the current mirror.

Figure 14:
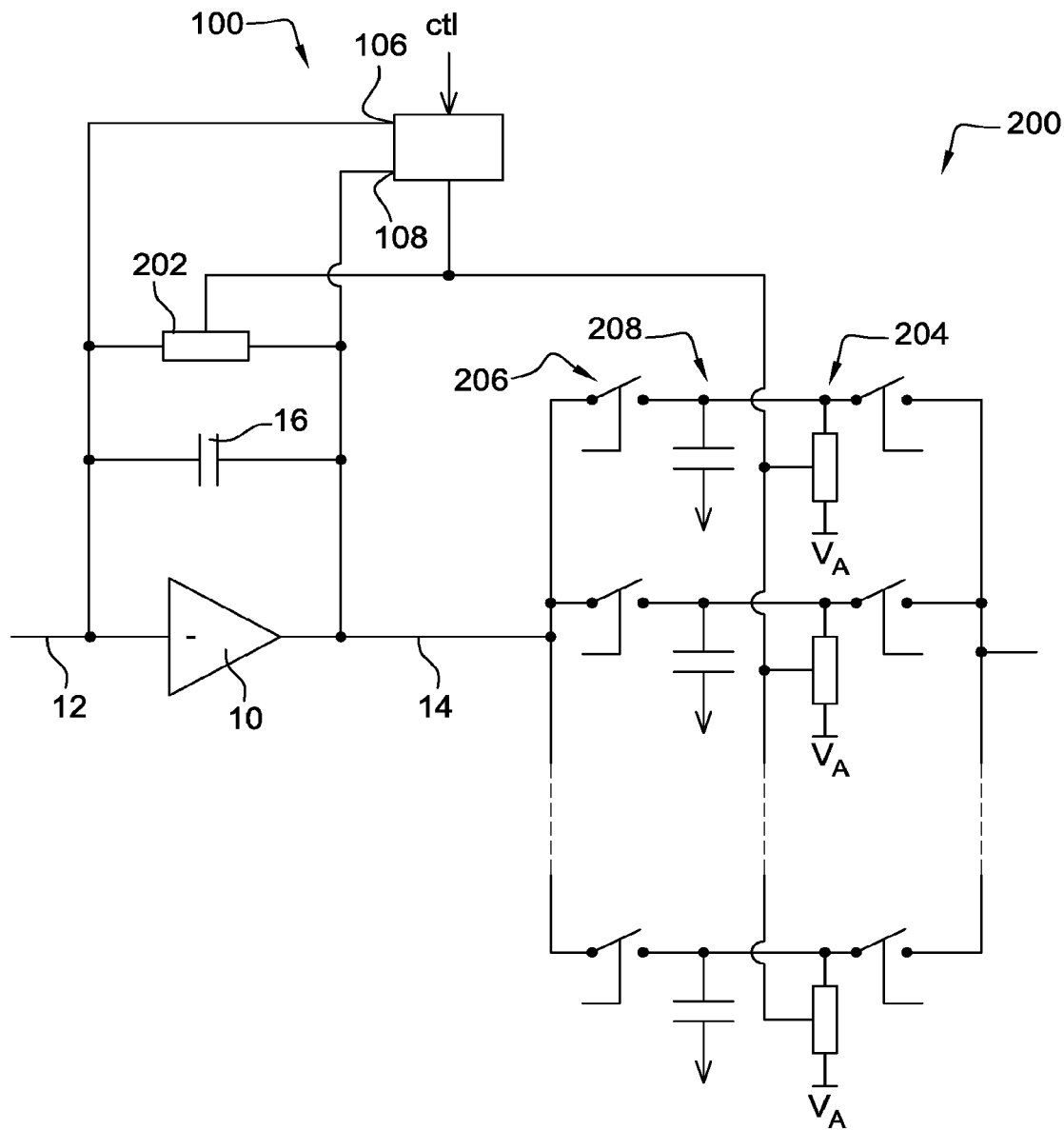
FIG. 14 shows an electronic circuit comprising a device for modifying the impedance value of a reference resistor.

Another example of application of the device 100 is described in connection with FIG. 14 in which an electronic circuit 200 is shown.

The electronic circuit 200 includes the charge amplifier 10 and the integration capacitance 16 connected in parallel between the input 12 and the output 14 of the amplifier 10. A FET transistor 202 is also connected in parallel between the input 12 and the output 14 of the amplifier 10. The drain of the transistor 202 is connected to the output 14 of the amplifier 10 and the source of the transistor 202 is connected to the input 12 of the amplifier 10. Several other FET transistors 204 have their drain connected, via switches 206, to the output of the amplifier 10. The switches 206 are controlled for example by a phase generator, as described for example in document WO 2013/034779 A1. The electric potential V$_A$ obtained on the terminal 106 is repeated on the sources of the transistors 204.

The gates of the transistors 202, 204 are connected to the gate of the first transistor 116 of the device 100 according to one of the embodiments previously described. The terminal 106 of the device 100 is connected to the input 12 of the amplifier 10 and the terminal 108 of the device 100 is connected to the output 14 of the amplifier. Thus, the transistor 202 is connected in parallel to the transistor 116 of the device 100. The transistor(s) 204 is (are) thus connected in parallel to the transistor 202 when the switch(es) 206 is (are) ON.

Being thus connected, the transistors 202, 204 form a current mirror. It is thus possible to consider each of the transistors 202, 204 as equivalent to a resistor, respectively named R$_{202}$ and R$_{204}$.

The circuit 200 also includes integration capacitances 208 connected in parallel to the transistors 204. In this circuit 200, it is attempted to establish an equality of the time constants R$_{202}$·C$_{16}$=R$_{204}$·C$_{208}$ with C$_{16}$ the value of the integration capacitance 16 and C$_{208}$ the total value of the integration capacitance(s) 208 connected to the charge amplifier 10, with C$_{208}$=m·C$_{16}$ and m a non-zero positive integer. It is thus attempted to achieve the relationship R$_{202}$=m·R$_{204}$. This is possible by controlling the transistors 202 and 204 by the gate of the first transistor 116 of the device 100 which drives thereby the values of the equivalent resistors R$_{202}$ and R$_{204}$. This resistor ratio m=R$_{202}$/R$_{204}$ is preserved whatever the multiplication ratio K of the device 100 which is determined by a control signal ctl. The control signal ctl is for example a N-bit digital signal applied to each of the gates of the control transistors of the mirrors, such as the transistor 146 of the current mirror 120 shown in FIG. 9.

The invention claimed is:

1. An electronic device, comprising:
   a reference resistor;
   two first terminals between which the reference resistor is connected, and two second terminals between which a modified impedance value of the reference resistor is obtained;
   a first circuit configured to apply between the two second terminals a voltage V$_{AB}$ equal to a voltage V$_{DE}$ between the two first terminals; and
   a second circuit configured to flow between the two second terminals a second current having a value i1 which is equal to a fraction of a first current i0 flowing in the reference resistor between the two first terminals, i0/i1 being at least 1000 and different than V$_{AB}$/V$_{DE}$.

2. The device according to claim 1, wherein the transistors included in the second circuit include at least one first field effect transistor (FET) the source and drain of which are each connected to one of the two second terminals and the gate of which is configured to receive an electric potential from the second circuit and the value of which depends on that of the first current.

3. The device according to claim 2, wherein the second circuit includes at least:
   a first current mirror comprising at least the first FET transistor and a second FET transistor; and
   a second current mirror comprising at least third and fourth FET transistors,
   wherein the first and second FET transistors are of a different type from that of the third and fourth FET transistors, and wherein the first and second FET transistors have channels with dimensions different from each other and/or the third and fourth FET transistors have channels with dimensions different from each other.

4. The device according to claim 3, wherein:
the drain of the fourth FET transistor is connected to one of the two first terminals;
the drain of the third FET transistor is connected to the drain of the second FET transistor;
the source of the second FET transistor is connected to the other of the two first terminals.

5. The device according to claim 4, wherein the second circuit further includes at least one third current mirror interposed between the drain of the third FET transistor and the drain of the second FET transistor.

6. The device according to claim 1, wherein the first circuit includes at least one first operational amplifier comprising a first input connected to one of the two first terminals, a second input connected to one of the two second terminals, and an output connected to the second circuit.

7. The device according to claim 3, wherein:
the first circuit includes at least one first operational amplifier comprising a first input connected to one of the two first terminals, a second input connected to one of the two second terminals, and an output connected to the second circuit;
an output of the first operational amplifier is connected to the sources of the third and fourth FET transistors, the gates of the third and fourth FET transistors are connected to the drain of the fourth FET transistor, and the first input of the first operational amplifier corresponds to an inverting input, or
the output of the first operational amplifier is connected to the gates of the third and fourth FET transistors, the sources of the third and fourth FET transistors are configured to receive a reference electric potential, and the first input of the first operational amplifier corresponds to a non-inverting input.

8. The device according to claim 6, wherein the first circuit further includes a second operational amplifier comprising an input connected to the other of the two second terminals and an output connected to the other of the two first terminals, or wherein the other of the two first terminals is connected to the other of the two second terminals.

9. The device according to claim 1, further including, when the second circuit includes a number n of current mirrors, with n an odd integer higher than or equal to 3, at least one third operational amplifier interposed between the output of the first operational amplifier and the second current mirror.

10. The device according to claim 1, further including a plurality of reference impedances with different values, and a third circuit configured to connect at least one of the plurality of reference impedances between the two first terminals.

11. The device according to claim 1, further including, when the second circuit includes current mirrors, a fourth circuit configured to modify the dimension ratio of the transistor channels of at least one of the current mirrors.

12. The device according to claim 1, wherein the reference resistor further comprises at least two second resistors forming a voltage dividing bridge and a first resistor connected in parallel to one of the two second resistors of the voltage dividing bridge.

13. An electronic circuit, comprising:
a charge amplifier;
an integration capacitance connected in parallel to the charge amplifier, between an input and an output of the charge amplifier; and
a device according to claim 1 connected in parallel to the charge amplifier, the second terminals of the device being connected to the input and output of the charge amplifier.

14. An electronic circuit, comprising:
a charge amplifier;
at least one electronic device according to claim 1;
a first integration capacitance connected in parallel to the charge amplifier, between an input and an output of the charge amplifier;
a first current mirror transistor connected in parallel to the charge amplifier, the source and drain of the first current mirror transistor being connected to the input and output of the charge amplifier;
a plurality of second current mirror transistors each having their drain connected to the output of the charge amplifier through a switch;
a plurality of second integration capacitances each connected in parallel to one of the sixth transistors,
wherein the second circuit includes at least one first field effect transistor (FET) transistor the source and drain of which are each connected to one of the two second terminals and the gate of which is configured to receive an electric potential from the second circuit and the value of which depends on that of the first current, and
wherein the first and second current mirror transistors are connected to the gate of the first FET transistor.

15. The device according to claim 1, wherein the fraction corresponds to a dimension ratio of transistors included in the second circuit.

* * * * *